United States Patent
Cho et al.

(10) Patent No.: US 12,020,739 B2
(45) Date of Patent: *Jun. 25, 2024

(54) MEMORY DEVICE FOR REDUCING ROW HAMMER DISTURBANCE, AND A METHOD OF REFRESHING THE SAME

(71) Applicant: Samsung Electronics Co., Ltd., Suwon-si (KR)

(72) Inventors: Sunghye Cho, Hwaseong-si (KR); Kijun Lee, Seoul (KR); Eunae Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/138,849

(22) Filed: Apr. 25, 2023

(65) Prior Publication Data
US 2023/0260562 A1 Aug. 17, 2023

Related U.S. Application Data

(63) Continuation of application No. 17/408,454, filed on Aug. 22, 2021, now Pat. No. 11,670,354.

(30) Foreign Application Priority Data

Feb. 23, 2021 (KR) .................. 10-2021-0023900

(51) Int. Cl.
*G11C 7/12* (2006.01)
*G11C 11/406* (2006.01)
(Continued)

(52) U.S. Cl.
CPC .............. *G11C 11/406* (2013.01); *G11C 7/12* (2013.01); *G11C 11/40611* (2013.01);
(Continued)

(58) Field of Classification Search
CPC .............. G11C 11/406; G11C 11/4087; G11C 11/4091; G11C 11/40622; G11C 11/40611; G11C 8/10; G11C 11/4085
See application file for complete search history.

(56) References Cited

U.S. PATENT DOCUMENTS 9,087,602 B2    7/2015   Youn et al.
9,236,110 B2    1/2016   Bains et al.
(Continued)

FOREIGN PATENT DOCUMENTS

CN       108154895 A    6/2018
KR   1020140141783 A   12/2014
(Continued)

*Primary Examiner* — Mushfique Siddique
(74) *Attorney, Agent, or Firm* — Muir Patent Law, PLLC

(57) ABSTRACT

A memory device includes a memory cell array connected to a plurality of wordlines and a plurality of bitlines; a row decoder configured to select a wordline, among the plurality of wordlines, in response to a row address; a column decoder configured to corresponding bitlines, among the plurality of bitlines, in response to a column address; a sense amplification circuit having a plurality of amplifiers connected to the selected corresponding bitlines; a row hammer detector configured to generate a refresh row address when the number of accesses to a row corresponding to the row address is a multiple of a predetermined value; and a refresh controller configured to perform a refresh operation on a row corresponding to the refresh row address. The row corresponding to the refresh row address is disposed adjacent to the row corresponding to the row address.

17 Claims, 11 Drawing Sheets

(51) Int. Cl.
  *G11C 11/408* (2006.01)
  *G11C 11/4091* (2006.01)
  *G11C 7/10* (2006.01)
  *G11C 8/10* (2006.01)

(52) U.S. Cl.
  CPC .... *G11C 11/40622* (2013.01); *G11C 11/4085* (2013.01); *G11C 11/4087* (2013.01); *G11C 11/4091* (2013.01); *G11C 7/1078* (2013.01); *G11C 8/10* (2013.01)

(56) References Cited

U.S. PATENT DOCUMENTS

| | | | |
|---|---|---|---|
| 9,589,606 B2* | 3/2017 | Lin | G06F 13/1636 |
| 9,978,440 B2 | 5/2018 | Cho | |
| 2012/0151263 A1* | 6/2012 | Rentschler | G06F 11/267 |
| | | | 714/E11.147 |
| 2014/0085995 A1 | 3/2014 | Greenfield et al. | |
| 2014/0156923 A1 | 6/2014 | Bains et al. | |
| 2014/0355332 A1* | 12/2014 | Youn | G11C 11/40615 |
| | | | 365/149 |
| 2015/0200002 A1 | 7/2015 | Lin et al. | |
| 2017/0117030 A1 | 4/2017 | Fisch et al. | |
| 2020/0211632 A1 | 7/2020 | Noguchi | |
| 2021/0057013 A1* | 2/2021 | Jenkinson | G11C 11/4078 |
| 2021/0272620 A1 | 9/2021 | Barry | |
| 2022/0051716 A1* | 2/2022 | Ayyapureddi | G06F 13/1636 |
| 2022/0068361 A1* | 3/2022 | Du | G11C 11/4076 |

FOREIGN PATENT DOCUMENTS

| | | |
|---|---|---|
| KR | 1020150085485 A | 7/2015 |
| WO | 2020163600 A1 | 8/2020 |

* cited by examiner

MEMORY DEVICE FOR REDUCING ROW HAMMER DISTURBANCE, AND A METHOD OF REFRESHING THE SAME

CROSS-REFERENCE TO RELATED APPLICATION(S)

This application is a Continuation of U.S. patent application Ser. No. 17/408,454 filed on Aug. 22, 2021, now Allowed, which claims benefit of priority to Korean Patent Application No. 10-2021-0023900 filed on Feb. 23, 2021 in the Korean Intellectual Property Office, the disclosure of each of which is incorporated herein by reference in its entirety.

BACKGROUND

The present inventive concept relates to a memory device and a method of operating the same.

In general, a dynamic random access memory (DRAM) may perform a refresh operation to retain stored data. That is, the DRAM may retain data stored in a cell capacitor by the refresh operation. With the development of process technology such as an increase in a degree of integrity, a gap between cells of a DRAM is gradually being reduced. In addition, due to the reduction in the gap between cells, interference from adjacent cells or wordlines is increasingly acting as an important data reliability factor. Even if the above-described interference is concentrated on a specific cell, it may be difficult to restrict access to a specific address in a random access memory such as a DRAM. Accordingly, a disturbance may occur for a specific cell, and a refresh characteristic for such a cell may also be affected.

SUMMARY

An aspect of the present inventive concept is to provide a memory device for reducing row hammer disturbance, and a method of operating the same.

According to an aspect of the present inventive concept, a memory device includes a memory cell array having a plurality of memory cells disposed in a plurality of rows and a plurality of columns and connected to a plurality of wordlines and a plurality of bitlines; a row decoder selecting a wordline, among the plurality of wordlines, in response to a row address; a column decoder selecting corresponding bitlines, among the plurality of bitlines, in response to a column address; a sense amplification circuit having a plurality of amplifiers connected to the selected corresponding bitlines; a row hammer detector configured to receive the row address, and output a refresh row address generated from the row address when the number of accesses to a row corresponding to the row address is a multiple of a predetermined value; a refresh controller performing a refresh operation on a row corresponding to the refresh row address. The row corresponding to the refresh row address may be disposed adjacent to the row corresponding to the row address.

According to an aspect of the present inventive concept, a method of operating a memory device including a plurality of memory cells disposed in a plurality of rows, the method includes receiving a row address; reading the number of row accesses and an overflow flag bit, corresponding to the row address; increasing the number of row accesses by 1; determining whether a modular calculated value for the increased number of row accesses is equal to zero, or the overflow flag bit is '1'; determining whether a buffer queue configured to store the row address is full, when the modular calculated value is equal to zero or the overflow flag bit is '1'; setting the overflow flag bit to '1,' when the buffer queue is full; updating the increased number of row accesses and the overflow flag bit; and performing a refresh operation on a row corresponding to a refresh row address generated from the row address.

According to an aspect of the present inventive concept, a method of operating a memory device including a plurality of memory cells disposed in a plurality of rows, the method includes receiving a row address; reading the number of row accesses corresponding to the row address; increasing the number of row accesses by 1; determining whether a modular calculated value for the increased number of row accesses is equal to zero; determining whether a buffer queue configured to store the row address is full, when the modular calculated value is equal to zero; retaining the number of row accesses, when the buffer queue is full; and performing a refresh operation on a row corresponding to a refresh row address generated from the row address.

BRIEF DESCRIPTION OF DRAWINGS

The above and other aspects, features, and advantages of the present inventive concept will be more clearly understood from the following detailed description, taken in conjunction with the accompanying drawings, in which.

The accompanying drawings may be provided to aid understanding of this embodiment, and may provide embodiments along with a detailed description.

DETAILED DESCRIPTION

Figure 1:
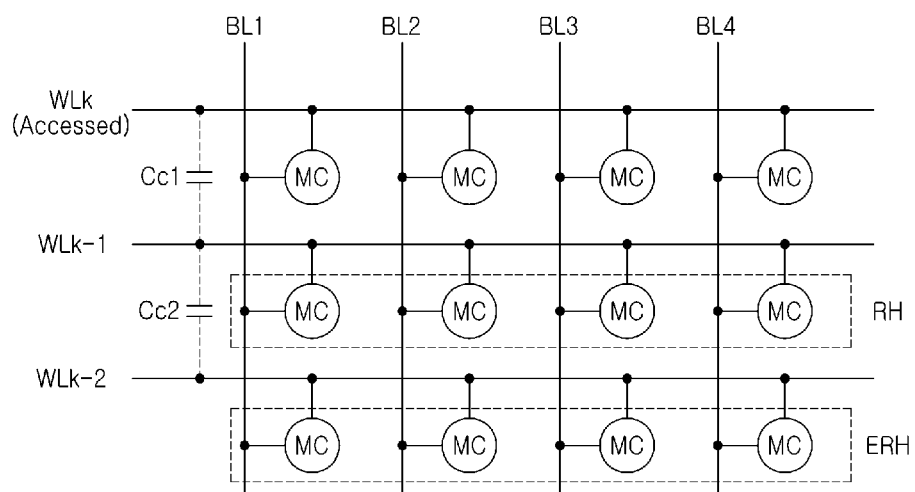
FIG. 1 is a view illustrating a general row hammer and an extended row hammer.

In the following, the present inventive concept will be described clearly and in sufficient detail to be easily implemented by those of ordinary skill in the art referring to the drawings.

A memory device according to the present inventive concept, and an operating method of the same, may reduce row hammer disturbance by using an overflow flag bit or by adjusting a value of an access count, to manage a missed row, when a row address is not stored due to an overflow of a buffer queue. As a result, the memory device of the present inventive concept may manage the disturbance on a low level, even when the overflow of the queue occurs. In the following embodiments, for convenience of description, the terms of the "row" and "row address" may be used interchangeably.

FIG. 1 is a view illustrating a row hammer RH and an extended row hammer ERH. Referring to FIG. 1, memory cells MC may be connected between wordlines WLk-2, WLk-1, and WLk (k is an integer) and bitlines BL1 to BL4. In this case, the memory cell MC may be a volatile memory cell or a nonvolatile memory cell. In the following, for convenience of description, the memory cell MC may be a volatile memory cell having an access transistor and a cell capacitor. For example, a gate terminal of the access transistor of the memory cell MC may be connected to a corresponding wordline, and one terminal thereof may be connected to a bitline BL.

In general, a selected wordline voltage (e.g., Vpp) may be provided to a selected wordline WLk during a read operation or a write operation. In this case, due to a capacitive coupling effect, a voltage of the adjacent wordlines (e.g., WLk-1 and WLk-2) may increase, even when the selected wordline voltage is not applied to the adjacent wordlines. This capacitive coupling may be illustrated as parasitic capacitances Cc1 and Cc2 between wordlines. When the selected wordline WLk is repeatedly accessed, charge may gradually leak from memory cells corresponding to the adjacent wordlines WLk-1 and WLk-2. A phenomenon for the nearest adjacent wordline WLk-1 may be referred to as the row hammer RH, and a phenomenon for the next adjacent wordline WLk-2 may be referred to as the extended row hammer ERH. A Patent Application of a technology for detecting and refreshing the row hammer was applied by Samsung Electronics, and is described in U.S. Pat. No. 9,087,602, which is incorporated by reference in this application.

A memory device according to the present inventive concept may add an overflow flag bit OF_FLAG to manage a missed row (i.e., a missed row address), when an overflow occurs in a queue. For example, a row address stored in a queue (e.g., a buffer queue) may have an overflow flag bit OF_FLAG set to '0,' and a row address not stored in a queue may have an overflow flag bit OF_FLAG set to '1.' It should be understood that an overflow situation and values of the overflow flag bit may not be limited thereto.

Figure 2:
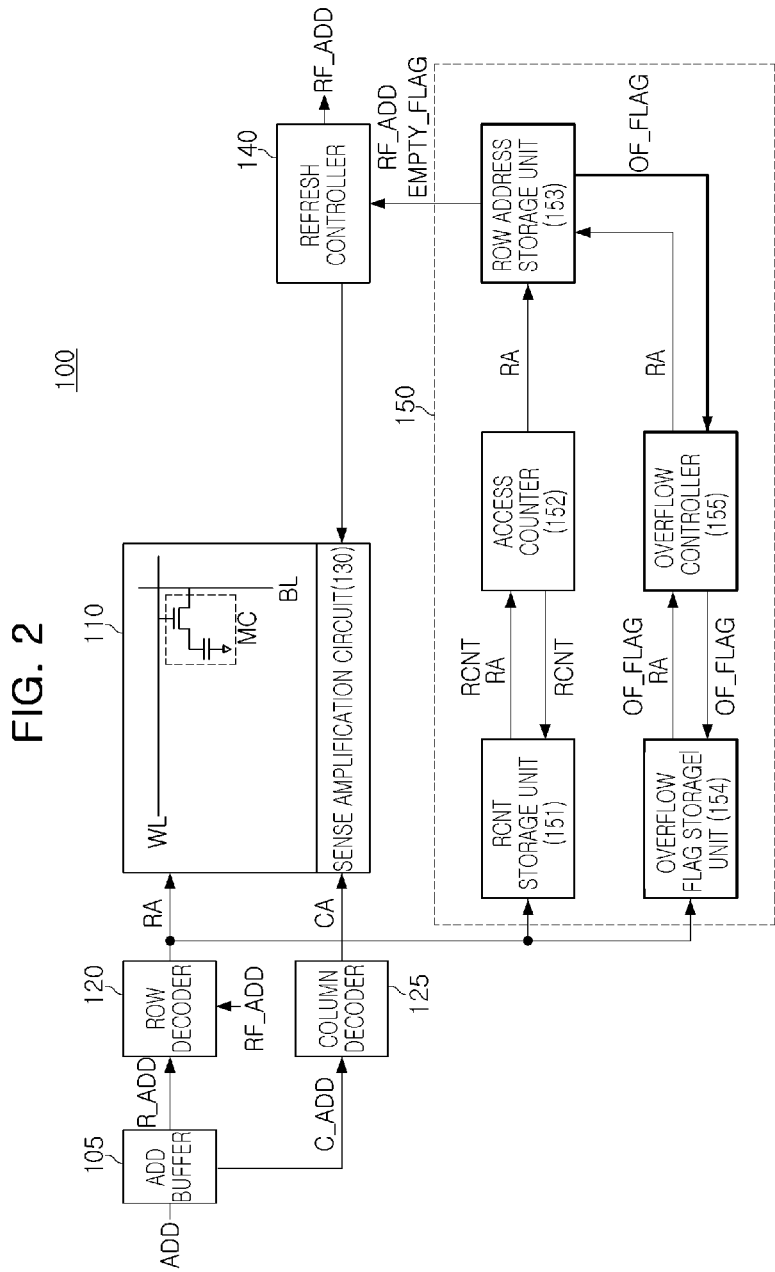
FIG. 2 is a view illustrating a memory device according to example embodiments.

FIG. 2 is a view illustrating a memory device 100 according to example embodiments. Referring to FIG. 2, a memory device 100 may include an address buffer 105, a memory cell array 110, a row decoder 120, a column decoder 125, a sense amplification circuit 130, a refresh controller 140, and a row hammer detector 150.

The memory cell array 110 may include a plurality of bank arrays. Each of the bank arrays may include a plurality of memory cells MC formed at portions at which a plurality of wordlines WL and a plurality of bitlines BL intersect each other. As illustrated in FIG. 2, each of the plurality of memory cells may be implemented with a select transistor and a capacitor.

The address buffer 105 temporarily stores an address ADD inputted from an external device (e.g., a memory controller). The address buffer 105 provides a row address R_ADD to the row decoder 120 and a column address C_ADD to the column decoder 125. The address ADD in an external signaling scheme is converted into one in an internal signaling scheme of the memory device 100 through the address buffer 105.

The row decoder 120 may be implemented to receive the row address R_ADD, decode the row address R_ADD, output a row address RA (e.g., a decoded row address RA), and activate a wordline corresponding to the row address RA. For example, the activated row decoder may select a wordline corresponding to the row address RA, and apply a wordline voltage to the selected wordline. In a refresh operation, the row decoder 120 may receive a refresh row address RF_ADD from the refresh controller 140.

The column decoder 125 may be implemented to receive a column address CA, select bitlines corresponding to the column address CA, and connect sense amplifiers corresponding to the selected bitlines.

The sense amplification circuit 130 may include a plurality of sense amplifiers connected to a plurality of bitlines. Each of the plurality of sense amplifiers may be implemented to sense data corresponding to a bitline. For example, each of the sense amplifiers may be connected to a bitline and a complementary bitline. Each of the plurality of sense amplifiers may be implemented to write data to a memory cell connected to a selected bitline, or to sense stored data from the memory cell connected to the selected bitline. In addition, each of the plurality of sense amplifiers may be implemented to rewrite the stored data in the memory cell in a refresh operation.

The refresh controller 140 may be implemented to control the refresh operation of the memory device 100 in response to a refresh command. A command corresponding to a general auto refresh operation may be received through a combination of control signals (e.g., /RAS, /CAS, and/WE). A command decoder (not shown) may decode the received control signals to determine the refresh operation, and may transmit the refresh command to the refresh controller 140. The refresh controller 140 may control the row decoder 120 and the sense amplification circuit 130 to perform the refresh operation on a selected region of the memory cell array 110.

In addition, the refresh controller 140 may perform the refresh operation internally or in response to an external command, with respect to a refresh row address RF_ADD corresponding to a detection signal.

In addition, when performing the refresh operation, the refresh controller 140 may receive information on whether or not storage capacity is empty, from a row address storage unit 153. When storage capacity is empty, the refresh controller 140 may refresh row lines (or wordlines) in a predetermined order. In this case, the row address storage unit 153 may provide an empty flag bit EMPTY_FLAG as '1'. When storage capacity is not empty, the refresh controller 140 may receive a refresh row address RF_ADD from the row address storage unit 153, and may refresh one or more wordlines corresponding to the refresh row address RF_ADD. In this case, the row address storage unit 153 may provide the empty flag bit EMPTY_FLAG as '0'.

In other example embodiments, the refresh controller 140 may receive the row address RA from the row address storage unit 153 and generate a refresh row address RF_ADD corresponding to the one or more wordlines adjacent to the specific wordline of the row address RA.

The row hammer detector 150 may be implemented to receive the row address RA and output the refresh row address RF_ADD and the empty flag bit EMPTY_FLAG.

The row hammer detector 150 may include an RCNT storage unit 151, an access counter 152, the row address storage unit 153, an overflow flag storage unit 154, and an overflow controller 155.

The RCNT storage unit 151 may be implemented to store a row access count RCNT (i.e., the number of row accesses)

corresponding to the received row address RA. Herein, for convenience of description, the terms of the row access count RCNT and row access count value RCNT may be used interchangeably. In an embodiment, the RCNT storage unit 151 may store a row access count RCNT per row. For example, the RCNT storage unit 151 may store the number of accesses to a specific row (e.g., a wordline). In another embodiment, the RCNT storage unit 151 may store a row access count RCNT per row group. For example, the RCNT storage unit 151 may store the number of accesses to a specific cell region (e.g., wordlines).

The access counter 152 may be implemented to read a row access count RCNT corresponding to the row address RA from the RCNT storage unit 151, and increase the row access count RCNT for the row address RA. Also, the access counter 152 may output the increased access count RCNT to be stored in the RCNT storage unit 151.

In an embodiment, the access counter 152 may receive the number of row accesses (X, i.e., a row access count RCNT) from the RCNT storage unit 151, and may increase the number of row accesses by 1 (i.e., X+1). In addition, the access counter 152 may transmit the increased number of row accesses (X+1) to the RCNT storage unit 151. In an embodiment, when the increased number of row accesses (X+1) matches a reference value, the access counter 152 may transmit a row address RA to the row address storage unit 153. Herein, the term "match" may be referred to as "equal to" or "multiple of".

In an embodiment, the reference value may vary according to an operation mode. The operation mode may mutually share a buffer queue (e.g., a row address storage unit) storing the row address RA. In another embodiment, the reference value may be constant regardless of the operation mode.

The row address storage unit 153 may be implemented to store the row address RA output from the access counter 152 or a row address RA output from the overflow controller 155. In an embodiment, the row address storage unit 153 may include at least one register. The row address storage unit 153 may generate and store a refresh row address RF_ADD corresponding to one or more wordlines adjacent to a specific wordline corresponding to the row address RA and store the generated refresh row address RF_ADD. In this case, the row address storage unit 153 may provide the refresh row address RF_ADD to the refresh controller 140. In other example embodiments, the refresh controller 140 may generate the refresh row address RF_ADD based on the received row address RA from the row address storage unit 153.

In addition, when the row address RA is input, the row address storage unit 153 may determine whether storage capacity of the row address storage unit 153 is full, and may transmit corresponding information to the overflow controller 155. In this case, the row address storage unit 153 may provide the overflow flag bit OF_FLAG as '1' to the overflow controller 155. When storage capacity is not full, the row address storage unit 153 may store the received row address RA or a refresh row address RF_ADD corresponding to the received row address RA which the number of accesses matches the reference value. In this case, the row address storage unit 153 may provide the overflow flag bit OF_FLAG as '0' to the overflow controller 155.

In addition, in a refresh operation, the row address storage unit 153 may determine whether or not storage capacity is empty, and may transmit corresponding information to the refresh controller 140. When storage capacity is not empty (e.g., the EMPTY_FLAG is '0') in a refresh operation, the row address storage unit 153 may transmit some or all of the stored row addresses RA or refresh row addresses RF_ADD to the refresh controller 140, and may remove the transmitted row addresses RA or refresh row addresses RF_ADD from the row address storage unit 153.

The overflow flag storage unit 154 may be implemented to receive the row address RA and store an overflow flag bit OF_FLAG corresponding to the row address RA. For example, the overflow flag storage unit 154 may store '0' for rows stored in a queue (e.g., a row address storage unit 153), and may store '1' for missed rows not stored in the queue.

Also, when access to a row occurs, the overflow flag storage unit 154 may output a received row address RA and an overflow flag bit OF_FLAG corresponding to the received row address RA, to the overflow controller 155.

In addition, the overflow flag storage unit 154 may receive and store an overflow flag bit OF_FLAG from the overflow controller 155.

The overflow controller 155 may receive a row address RA and an overflow flag bit OF_FLAG from the overflow flag storage unit 154, and may determine whether or not the row address RA is provided to the row address storage unit 153 in response to the overflow flag bit OF_FLAG.

When the overflow flag bit OF_FLAG is '1,' the overflow controller 155 may transmit the row address RA to the row address storage unit 153.

In an embodiment, after receiving information on whether or not storage capacity is full of the row address storage unit 153, when the storage capacity is full, the overflow controller 155 may set the overflow flag bit OF_FLAG as '1,' and the set overflow flag bit OF_FLAG as '1' may be transmitted to the overflow flag storage unit 154.

In an embodiment, after receiving information on whether or not storage capacity is full of the row address storage unit 153, when the storage capacity is not full, the row address storage unit 153 may set the overflow flag bit OF_FLAG as '0,' and the set overflow flag bit OF_FLAG as '0' may be transmitted to the overflow flag storage unit 154.

In example embodiments the memory device 100 may manage a missed row address by indicating an overflow flag bit OF_FLAG without increasing an area, when there is no empty space in the row address storage unit 153 to store a row address corresponding to row hammer/extended row hammer such that the memory device 100 may reduce row hammer disturbance.

Figure 3A:
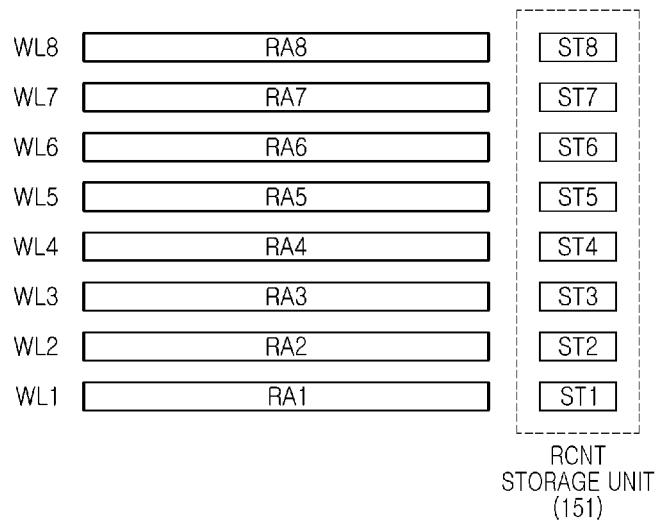
FIGS. 3A and 3B are views illustrating an RCNT storage unit according to example embodiments.
Figure 3B:
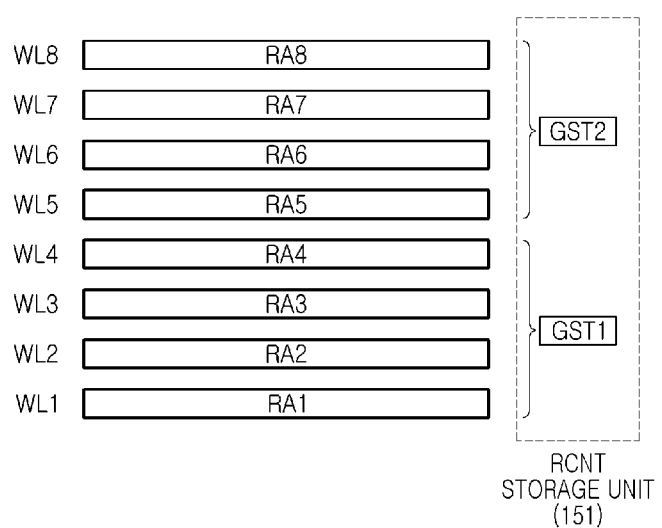

FIGS. 3A and 3B are views illustrating an RCNT storage unit 151 according to example embodiments. In an embodiment, as illustrated in FIG. 3A, an RCNT storage unit 151 may include storage units ST1 to ST8 storing a row access count RCNT per wordline corresponding to a row address RA. In this case, each of the storage units ST1 to ST8 may include at least one count cell implemented to have a structure, identical to those of a memory cell MC.

In another embodiment, as illustrated in FIG. 3B, an RCNT storage unit 151 may include two groups of storage units GST1 and GST2 storing a row access count RCNT per group of wordlines corresponding to a row address RA.

Figure 4:
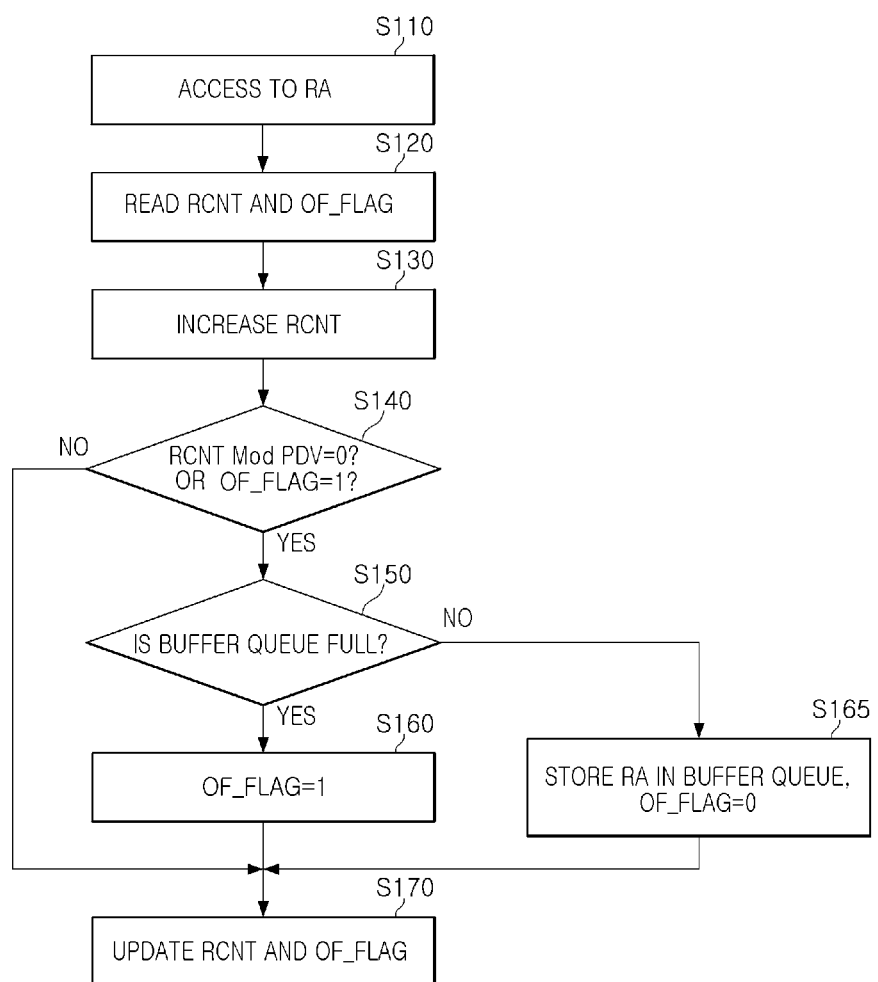
FIG. 4 is a flowchart illustrating a row hammer detection operation of a memory device according to example embodiments.

FIG. 4 is a flowchart illustrating a row hammer detection operation of a memory device 100 according to example embodiments. Referring to FIGS. 2 to 4, a row hammer detection operation of a memory device 100 may be performed as follows.

A row address RA may be received (S110). A row access count RCNT and an overflow flag bit OF_FLAG, corresponding to the row address RA, may be read (S120). An access counter 152 may count-up the read row access count RCNT (S130). Thereafter, a modular operation for the row access count RCNT may be performed. For example, in S140, if the row access count RCNT is 200 and a predetermined value PDV as modulus is 100 the remainder is 0. In this case, it may be expressed as (200 mod 100=0). It may be determined whether or not the modular calculated value is zero or the read overflow flag bit OF_FLAG is '1' (S140). For example, when the row access count value RCNT is a multiple of the predetermined value PDV the remainder is zero.

When the modular calculated value is zero or the read overflow flag bit OF_FLAG is 1,' it may be determined whether or not a buffer queue is full (S150). In this case, the buffer queue may be the row address storage unit 153 illustrated in FIG. 2. When the buffer queue is full, the overflow flag bit OF_FLAG may become '1' (S160), and S170 may be performed. When the buffer queue is not full, the row address RA RA may be stored and may generate the refresh row address RF_ADD in the buffer queue, the overflow flag bit OF_FLAG may become '0,' and S170 will be performed.

When the modular calculated value is not zero or the read overflow flag bit OF_FLAG is not '1,' S170 may proceed. For example, in S140, if the row access count RCNT is 210 and a predetermined value PDV as modulus is 100 the remainder is 10 (i.e., not zero). In this case, it may be expressed as (210 mod 100=10), and the row access count value RCNT is not a multiple of the predetermined value PDV.

In S170, the row access count RCNT and the overflow flag bit OF_FLAG may be updated (S170).

A row hammer detector 150 (refer to FIG. 2) according to the present inventive concept may express a missed row address not stored in a buffer queue due to occurrence of overflow (i.e., when the row address storage unit 153 is full) as an overflow flag bit, and may thus input the row address in the buffer queue when the next access occurs corresponding to the row address. In an embodiment, a row access count value and an overflow flag bit may be stored per row. When accessing a row, the row access count value may be increased by 1. When the overflow flag bit is '1' or the row access count value is a multiple of a specific reference value, a corresponding row address RA may be transmitted to the buffer queue. For example, the access counter 152 may transmit the row address RA to the row address storage unit 153 when the increased number of row accesses (X+1) matches (or is multiple of) the reference value (or, the predetermined value PDV). For example, the overflow controller 155 may transmit the row address RA to the row address storage unit 153 when the overflow flag bit OF_FLAG of the row address RA is '1'. When there is an empty space in the buffer queue, the row address RA may be stored in the buffer queue, and the overflow flag bit OF_FLAG may be set to '0.' When the buffer queue is full, the row address RA may not be input, and the overflow flag bit OF_FLAG may be set to 'b1.'

In example embodiments, a memory device according to the present inventive concept may be implemented by adjusting an access count value without using an overflow flag bit. For example, the memory device may increase an access count value in case of a row address input to the RCNT storage unit 151, may retains the access count value in case of a row address not input to the queue, and may transmit a corresponding row address to the queue when accessing a missed row.

Figure 5:
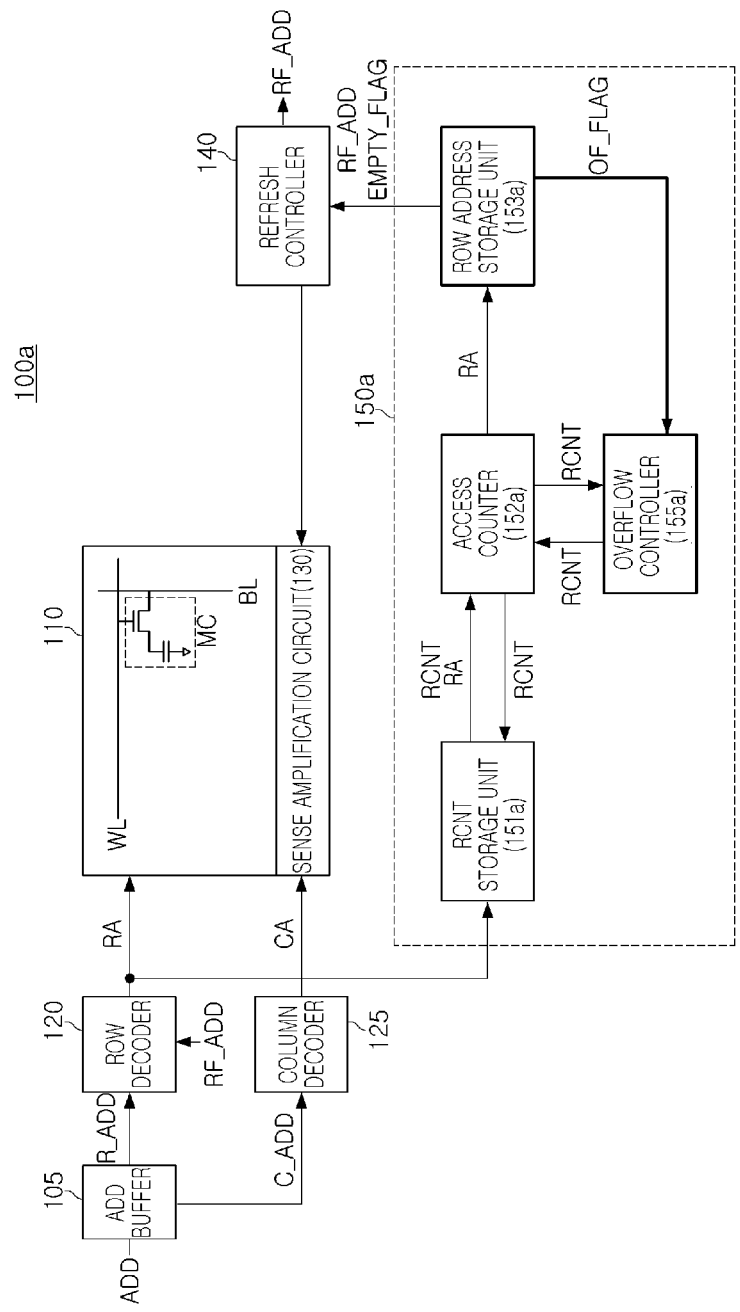
FIG. 5 is a view illustrating a memory device according to example embodiments.

FIG. 5 is a view illustrating a memory device 100a according to example embodiments. Referring to FIG. 5, a memory device 100a may be implemented to detect RH/ERH without storing an overflow flag bit, as compared to the memory device 100 illustrated in FIG. 2.

A row hammer detector 150a may include an RCNT storage unit 151a, an access counter 152a, a row address storage unit 153a, and an overflow controller 155a.

The RCNT storage unit 151a may be implemented to store a row access count RCNT corresponding to a received row address RA.

The access counter 152a may be implemented to read a row access count RCNT corresponding to a row address RA from the RCNT storage unit 151a, and increase a row access count RCNT for the row address RA. Also, the access counter 152a may output the increased row access count RCNT to be stored in the RCNT storage unit 151a. Also, the access counter 152a may transmit the row access count RCNT to the overflow controller 155a, and may receive the row access count RCNT from the overflow controller 155a.

In addition, the access counter 152a may receive the number of row accesses (X) from the RCNT storage unit 151a, and may increase the number of row accesses (X) by 1 (i.e., X+1). When the increased number of row accesses (X+1) is less than a reference value (or a predetermined value PDV), the access counter 152a may transmit the increased number of row accesses (X+1) to the RCNT storage unit 151a. When the increased number of row accesses (X+1) matches the reference value, the access counter 152a may transmit the row address RA to the row address storage unit 153a. In addition, when the increased number of row accesses (X+1) matches the reference value, the access counter 152a may transmit the increased number of row accesses (X+1) to the overflow controller 155a. In addition, when the increased number of row accesses (X+1) matches the reference value, the access counter 152a may receive the number of changed row accesses from the overflow controller 155a, and may store the number of received row accesses in the RCNT storage unit 151a.

The row address storage unit 153a may be implemented to store the refresh row address RF_ADD generated from the row address RA received from the access counter 152a. In other example embodiments, the row address storage unit 153a may store the row address RA received from the access counter 152a.

The overflow controller 155a may receive a row access count RCNT from the access counter 152a, may receive an overflow flag bit OF_FLAG from the row address storage unit 153a, and may output a row access count RCNT to the access counter 152a.

In an embodiment, after receiving information on whether or not storage capacity is full of the row address storage unit 153a, when the storage capacity is not full, the overflow controller 155a may transmit the number of row accesses (X+1), received from the access counter 152a, to the access counter 152a.

In an embodiment, after receiving information on whether or not storage capacity is full of the row address storage unit 153a, when the storage capacity is full, the overflow controller 155a may decrease the number of row accesses (X+1), received from the access counter 152a, by 1, and may transmit the decreased number of row accesses (X) to the access counter 152a.

In example embodiments, the memory device 100a may manage a missed row address by adjusting the number of row accesses, when there is no empty space in the row address storage unit 153a to store a row address RA or a refresh row address RF_ADD corresponding to row hammer/extended row hammer such that the memory device 100a may reduce row hammer disturbance.

Figure 6:
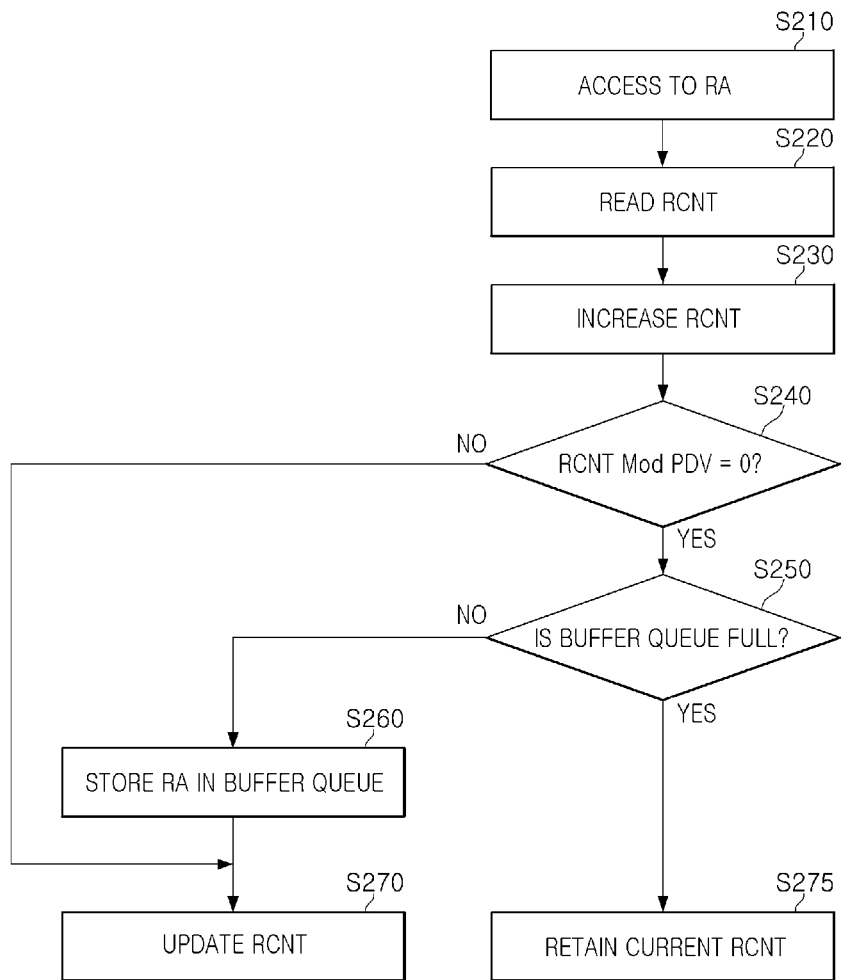
FIG. 6 is a flowchart illustrating a row hammer detection operation of a memory device according to example embodiments.

FIG. 6 is a flowchart illustrating a row hammer detection operation of a memory device 100*a* example embodiments. Referring to FIGS. 5 and 6, a row hammer detection operation of a memory device 100*a* may be performed as follows.

A row address RA may be received (S210). A row access count RCNT (X) corresponding to the row address RA may be read (S220). An access counter 152*a* may increase the read row access count RCNT (X+1) (S230). Thereafter, it may be determined whether or not the modular calculated value is zero (S240). For example, when the row access count value RCNT is a multiple of the predetermined value PDV the remainder is zero.

When the modular calculated value for the increased row access count RCNT (X+1) is equal to or multiple of the predetermined value PDV, it may be determined whether or not a buffer queue is full (S250). When the buffer queue is not full, the row address RA may be stored in the buffer queue (S260), and S270 may be performed. When the buffer queue is full, a row access count storage unit 151*a* may retain a current row access count RCNT (i.e., X) (S275).

When the modular calculated value for the increased row access count RCNT is not zero, S270 may be performed. The row access count RCNT increased in S270 may be updated in the row access count storage unit 151*a*.

A row hammer detector 150*a* of a memory device 100*a* according to the present inventive concept may retain a current row access count value (e.g., X), without increasing a row access count RCNT, to a missed row in a buffer queue due to occurrence of overflow, and may thus input the row in the buffer queue when the next access occurs corresponding to the row address RA. In an embodiment, a row access count value may be stored per row. When accessing a row, the row access count value may be increased by 1. When the number of row accesses is a multiple of a specific threshold value, a corresponding row address RA may be transmitted to the buffer queue. When there is an empty space in the buffer queue, the row address RA may be stored in the buffer queue, and a row access count value increased by 1 may be stored in the RCNT storage unit 151*a*. When the buffer queue is full and the row address RA may not be input, the read row access count value may be stored in the RCNT storage unit 151*a*.

Figure 7:
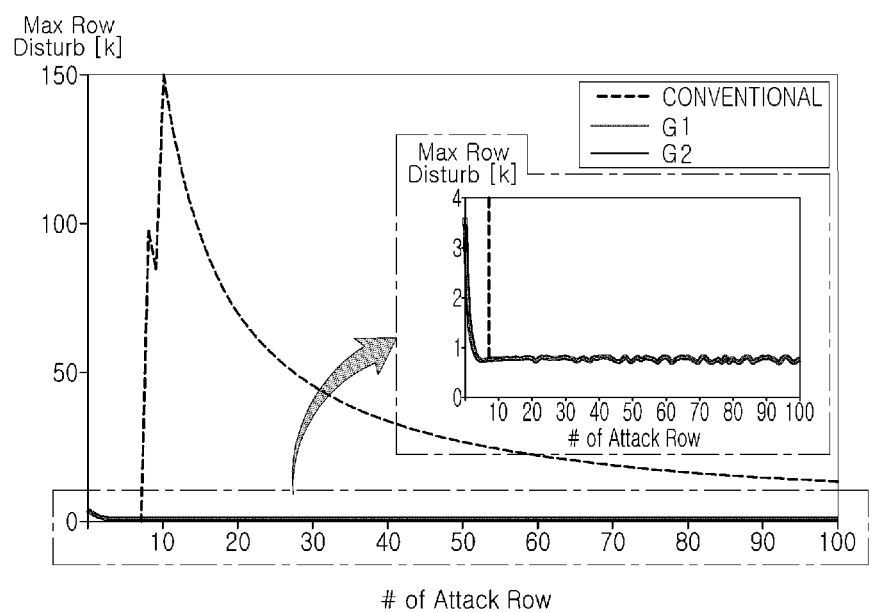
FIG. 7 is graphs illustrating a simulation result between memory devices according to the present inventive concept and a conventional memory device.

FIG. 7 is graphs illustrating a simulation result between memory devices according to the present inventive concept and a conventional memory device. Referring to FIG. 7, it can be seen that a problem of large disturbance of rows in a specific number of rows/ACTs may be solved by implementing of the present inventive concepts. For example, in the present inventive concepts, the disturbance may be decreased below 1K. Herein, the disturbance 1K means that a row is not in a refresh state until a specific row is accessed 1K in a predetermined period. In the graphs of FIG. 7, a horizontal axis represents a number of attack rows, a vertical axis represents the maximum row disturbance in a unit K. Referring to FIG. 7, the maximum row disturbance may be reduced as shown in a first graph G1 illustrating a simulation result according to the embodiment of FIG. 2 and a second graph G2 illustrating a simulation result according to the embodiment of FIG. 5. Herein, an attack row may mean that the access to a specific row is concentrated during a predetermined period. According to example embodiments, the maximum disturbance may be reduced under 1K from 10K to 150K as shown in FIG. 7.

When access counts are accumulated and managed per row, a memory device according to the present inventive concept may perform a refresh operation in which an address of a row of which access count is a multiple of a specific value is input into a queue, and is managed. As a result, when a missed row not input to the queue occurs due to insufficient space in the queue, a corresponding row may not be managed as a refresh state, and high disturbance may be thus affected. In particular, a reason for not initializing when an access count reaches a threshold value may be that ERH management may be efficient since an address of a row of which access count is a multiple of a specific value is input into a queue. A memory device according to the present inventive concept may manage hammer disturbance at a low level, even when overflow of a queue occurs.

Figure 8:
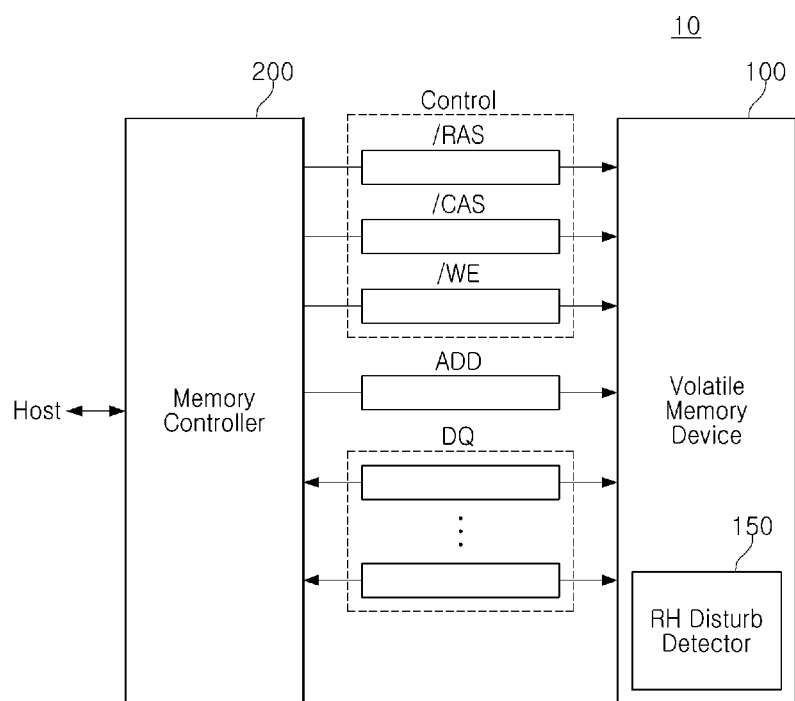
FIG. 8 is a view illustrating a memory system according to example embodiments.

FIG. 8 is a view illustrating a memory system 10 according to example embodiments. Referring to FIG. 8, a memory system 10 may include a memory device 100 and a memory controller 200.

The memory device 100 may include a row hammer detector 150 detecting the row hammer or the extended row hammer, illustrated in FIGS. 1 to 7. The memory device 100 may detect whether or not disturbance is concentrated on a specific address in an operation period in which a refresh operation is not performed. Alternatively, the memory device 100 may detect whether or not disturbance is concentrated on a specific address in an operation period in which frequency of occurrence of a refresh operation is relatively low. When the number of detected disturbances exceeds a threshold value, the memory device 100 may output a warning signal externally. In this case, the warning signal may be a signal output through a specific pin, or may be data output in a data format.

The memory device 100 may receive a refresh command from the memory controller 200, after outputting the warning signal externally. The memory device 100 may perform a refresh operation in response to the refresh command from the memory controller 200. For example, the refresh operation may be continuously performed on wordlines adjacent to a wordline on which disturbance is concentrated. The memory device 100 may perform a refresh operation on a corresponding wordline in response to a refresh command from the memory controller 200. After the memory device 100 outputs the warning signal externally, the memory device 100 may perform a refresh operation on its own, without receiving the refresh command from the memory controller 200.

The memory controller 200 may provide an interfacing between a host and the memory device 100. The memory controller 200 may communicate data and signals with the memory device 100 by control signal lines (e.g., lines for /RAS, /CAS, and /WE), an address line (ADD), data lines (DQ), a warning signal line, and the like. In particular, the memory controller 200 may transmit a refresh command with reference to the warning signal provided from the memory device 100. For example, when the warning signal output from the memory device 100 is activated, the memory controller 200 may transmit an auto refresh command set by control signals (e.g., /RAS, /CAS, and /WE) to the memory device 100.

The memory controller 200 may transmit a command set provided to the memory device 100 with reference to the control signals (e.g., /RAC, /CAS, /WE). In a typical DRAM, an active command and an auto refresh command may be determined by a combination of the control signals (e.g., /CS, /RAC, /CAS, /WE). In addition, a self refresh command may be identified by a combination of an auto refresh command and a clock enable signal. It should be understood that a refresh command issued by a memory controller 200 of the present inventive concept is not limited thereto.

In a memory system including a memory device 100 and a memory controller 200 of the present inventive concept, when disturbance is concentrated on a specific memory region, a refresh operation on a memory region on which interference is concentrated may be forcibly performed. To this end, the memory device 100 may detect the number or magnitude of the disturbance. When the disturbance reaches a threshold value, the memory device 100 may output a warning signal externally. Then, the memory controller 200 may determine the warning signal as a refresh request and may provide a refresh command to the memory device 100. The memory device 100 may perform a refresh operation on a memory region internally excessively exposed to interference, without providing a refresh command from the memory controller 200.

Figure 9:
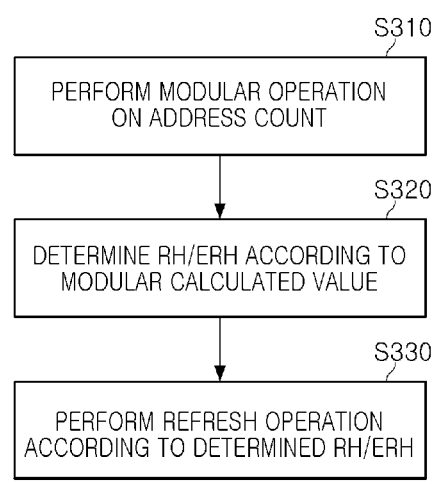
FIG. 9 is a flowchart illustrating a refresh operation of a memory system according to example embodiments.

FIG. 9 is a flowchart illustrating a refresh operation of a memory system according to example embodiments. Referring to FIGS. 8 and 9, a refresh operation may be performed as follows.

When accessing a row address according to a write operation or a read operation, a row hammer detector 150 may read an address count corresponding to the accessed row address, and may perform a modular operation on the read address count (S310). The row hammer detector may detect row hammer or extended row hammer according to a modular calculated value (S320). A refresh operation may be performed on a row address corresponding to the detected row hammer or the detected extended row hammer (S330).

Figure 10:
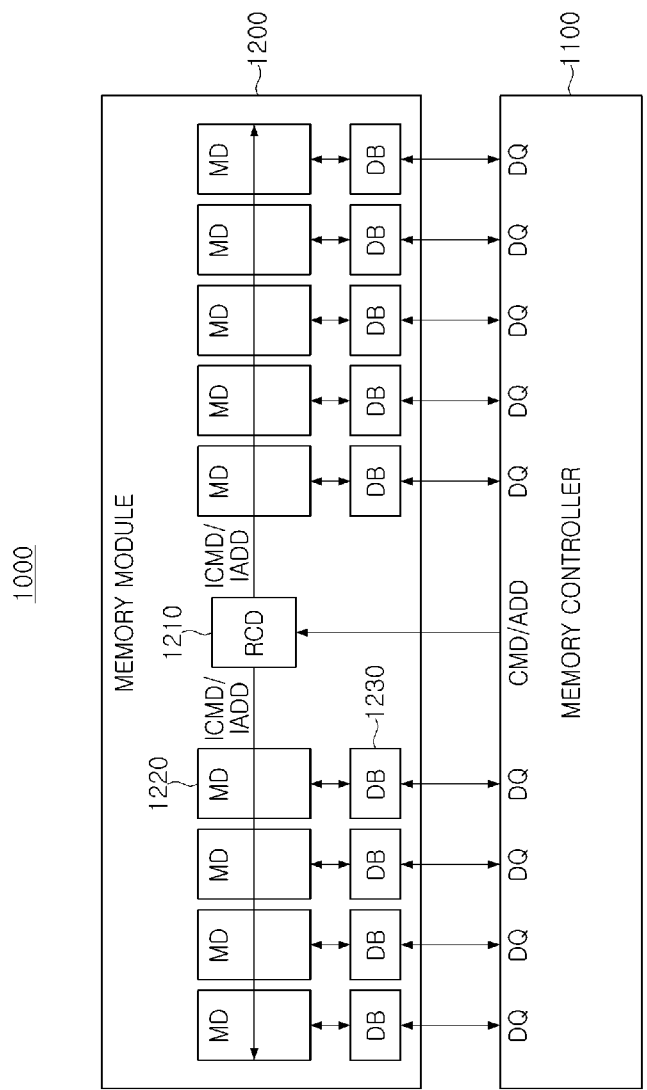
FIG. 10 is a view illustrating a memory system according to example embodiments.

FIG. 10 is a view illustrating a memory system 1000 according to an example of example embodiments. Referring to FIG. 10, a memory system 1000 may include a memory controller 1100 and a memory module 1200.

The memory module 1200 may include a register clock driver 1210, memory devices 1220, and data buffers 1230. For example, the register clock driver 1210 may be implemented using a system on chip (SoC), an application specific integrated circuit (ASIC), a field-programmable gate array (FPGA), or the like. For example, each of the memory devices 1220 may be implemented in the form of a chip or a package.

The register clock driver 1210 may receive a command CMD and an address ADD from the memory controller 1100. The register clock driver 1210 may transmit an internal command ICMD and an internal address IADD, based on the command CMD and the address ADD, respectively, to the memory devices 1220. For example, the register clock driver 1210 may transmit the command CMD and the address ADD as an internal command ICMD and an internal address IADD, respectively, as they are to the memory devices 1220, or may generate an internal command ICMD and an internal address IADD, based on the command CMD and the address ADD, respectively, and transmit the generated internal command ICMD and the generated internal address IADD to the memory devices 1220. For example, the register clock driver 1210 may generate an internal command ICMD and an internal address IADD for a row hammer refresh operation, based on the command CMD and the address ADD.

Each of the memory devices 1220 of the memory module 1200 may operate based on an internal command ICMD and an internal address IADD. For example, each of the memory devices 1220 may correspond to the memory device 100 or 100a described with reference to FIGS. 1 and 9. When each of the memory devices 1220 corresponds to the memory device 100 or 100a described with reference to FIGS. 1 to 9, and each of the memory devices 1220 does not store a row address due to overflow of a buffer queue, missed rows may be managed by using an overflow flag bit or by adjusting an access count value. Also, each of the memory devices 1220 may generate a refresh control signal and a row address for a row hammer refresh operation based on the internal command ICMD and the internal address IADD.

Each of the memory devices 1220 may perform a refresh operation based on the generated refresh row address RF_ADD. Each of the memory devices 1220 may perform a refresh operation based on an internal command ICMD and an internal address IADD, generated for a row hammer refresh operation.

The memory devices 1220 of the memory module 1200 may share a path for receiving an internal command ICMD and an internal address IADD. As another example, first memory devices 1220 of the memory module 1200 (for example, memory devices disposed on one side based on the register clock driver 1210) may share a first path for receiving an internal command ICMD and an internal address IADD. Second memory devices 1220 of the memory module 1200 (e.g., memory devices disposed on the other side based on the register clock driver 1210) may share a second path for receiving an internal command ICMD and an internal address IADD.

Each of the memory devices 1220 may communicate a data signal DQ with the memory controller 1100 through each of the data buffers 1230. Each of the memory devices 1220 may communicate the data signal DQ with the memory controller 1100 to exchange data with the memory controller 1100. For example, the memory devices 1220 may be accessed by the memory controller 1100 in parallel. Although nine (9) memory devices 1220 are illustrated in FIG. 10, it should be understood that the number of memory devices 1220 is not limited thereto.

Figure 11:
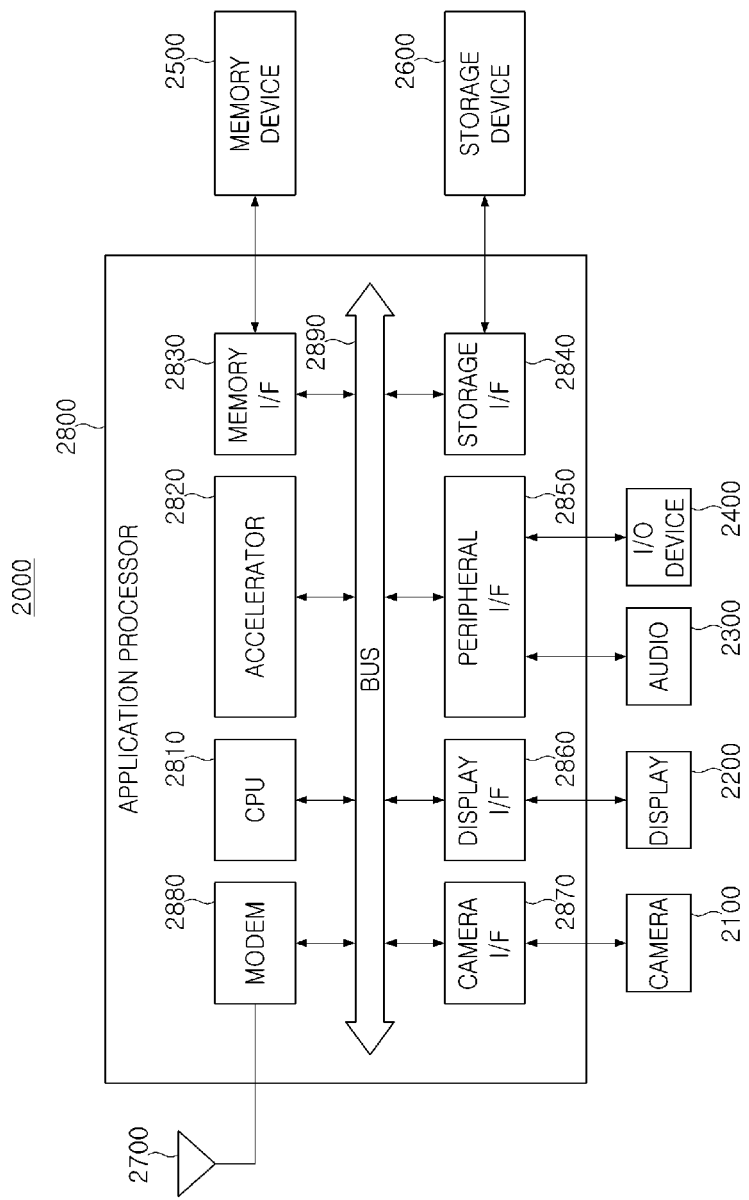
FIG. 11 is a view illustrating a mobile system according to example embodiments.

FIG. 11 is a view illustrating a mobile system 2000 according to example embodiments. Referring to FIG. 11, a mobile system 2000 may include a camera 2100, a display device 2200, an audio processing device 2300, an input/output device 2400, a memory device 2500, a storage device 2600, an antenna 2700, and an application processor (AP) 2800. In this case, the mobile system 2000 may be implemented as a laptop computer, a portable terminal, a smartphone, a tablet personal computer (PC), a wearable device, a healthcare device, or an IoT device. In addition, the mobile system 2000 may be implemented as a server or a personal computer.

The camera 2100 may capture an image or a video according to a user's control. The camera 2100 may communicate with the AP 2800 through a camera interface 2870.

The display device 2200 may be implemented in various forms, such as a liquid crystal display (LCD), an organic light emitting diode (OLED) display, an active-matrix OLED (AM-OLED), a plasma display panel (PDP), and the like. In an embodiment, the display device 2200 may be used as an input device of the mobile system 2000 by receiving an input signal through a user's touch. The display device 2200 may communicate with the AP 2800 through a display interface 2860.

The audio processing device 2300 may process audio data included in contents transmitted from the memory device 2500 or the storage device 2600. For example, the audio processing device 2300 may perform various types of processing such as encoding/decoding, noise filtering, and the like on audio data.

The input/output device 2400 may include devices providing digital input and output functions such as a device generating input from a user, a universal serial bus (USB), a storage, a digital camera, a secure digital (SD) card, a DVD, a network adapter, and the like. The audio processing device 2300 and the input/output device 2400 may communicate with the AP 2800 through a peripheral device interface 2850.

The AP 2800 may control an overall operation of the mobile system 2000 with a central processing unit 2810. For example, the AP 2800 may control the display device 2200 such that a portion of contents stored in the storage device 2600 may be displayed on the display device 2200. Also, when a user's input is received by the input/output device 2400 or the like, the AP 2800 may perform a control operation corresponding to the user's input. In addition, the AP 2800 may include a bus 2890, and various components such as a central processing unit 2810, a memory interface 2830, a storage interface 2840, a peripheral device interface 2850, a display interface 2860, a camera interface 2870, and the like may be connected to each other through the bus 2890.

The AP 2800 may be implemented as a system-on-chip (SoC) that drives an application program, an operating system (OS) and the like. Alternatively, the AP 2800 and other semiconductor components (e.g., the memory device 2500 and the storage device 2600) may be mounted based on various types of packaging techniques. For example, the AP 2800 and other semiconductor components may be mounted using packaging techniques such as a package-on-package (PoP), ball grid arrays (BGAs), chip scale packages (CSPs), a system-in-package (SIP), a multi-chip package (MCP), a wafer-level fabricated package (WFP), a wafer-level processed stack package (WSP), and the like.

In an embodiment, the AP 2800 may further include an accelerator 2820. The accelerator 2820 may be a functional block performing a specific function of the AP 2800. For example, the accelerator 2820 may include a graphics processing unit (GPU), which may be a functional block for processing graphic data, a neural processing unit (NPU), which may be a function block for performing an AI operation (for example, training and/or inference), or the like.

In an embodiment, the AP 2800 may include a modem 2880, or may include a modem chip separately located outside the AP 2800. The modem 2880 may transmit and receive wireless data through the antenna 2700, may modulate a signal transmitted from the antenna 2700, or may demodulate a signal received through the antenna 2700.

In an embodiment, the AP 2800 may include a memory interface 2830 for communication with the memory device 2500. A memory controller for controlling the memory device 2500 may be embedded in the memory interface 2830. Therefore, the memory device 2500 may be directly connected to the AP 2800. For example, the memory controller embedded in the memory interface 2830 may change read/write memory commands issued from the central processing unit 2810, the accelerator 2820, the modem 2880, or the like to a command for controlling the memory device 2500, to control the memory device 2500.

The AP 2800 may communicate with the memory device 2500 based on a predetermined interface protocol. For example, the AP 2800 may communicate with the memory device 2500 based on an interface conforming to the JEDEC standards, such as LPDDR4, LPDDR5, and the like. In addition, the AP 2800 may communicate with the memory device 2500 based on an interface conforming to the high-bandwidth JEDEC standards such as HBM, HMC, and Wide I/O.

In an embodiment, the memory device 2500 may be implemented based on a DRAM. However, the present inventive concept may not be limited thereto, and the memory device 2500 may be implemented based on a PRAM, an SRAM, an MRAM, an RRAM, an FRAM, or a hybrid RAM. The memory device 2500 may have a lower latency and a narrower bandwidth, as compared to the input/output device 2400 or the storage device 2600. The memory device 2500 may be initialized when the mobile system 2000 is powered on, and an operating system and application data may be loaded into the memory device 2500. Therefore, the memory device 2500 may be used as a temporary storage location for the operating system and the application data, or may be used as an execution space for various software codes.

In an embodiment, the memory device 2500 may correspond to the memory device 100 or 100*a* described with reference to FIGS. 1 to 9. For example, when a row address may not be stored due to overflow of a buffer queue, the memory device 2500 may use an overflow flag bit or adjust an access count value to manage a missed row.

In an embodiment, the AP 2800 may include a storage interface 2840 for communication with the storage device 2600. Therefore, the storage device 2600 may be directly connected to the AP 2800. For example, the storage device 2600 may be implemented as a separate chip, and the AP 2800 and the storage device 2600 may be assembled as a single package. For example, the storage device 2600 may be implemented based on a NAND flash memory, but the present inventive concept is not limited thereto.

In a memory device according to the present inventive concept, when the number of accesses per row is measured and a number of rows concentratedly accessed exceed row address storage capacity, disturbance of corresponding rows may be reduced to prevent the occurrence of errors. Therefore, reliability of the memory device may be improved.

In an embodiment, even when a row exceeding a threshold value exceeds row address storage capacity, corresponding rows may be detected and refreshed, to manage disturbance of the corresponding rows. In an embodiment, when the number of rows exceeding the threshold value exceeds row address storage capacity, and a missed row occurs in a row address storage unit, corresponding rows may be managed by a separate logic to manage disturbance on a low level.

When access to a row occurs, an access count storage unit according to the present inventive concept may output a row access count and a row address to an access counter. In an embodiment, the storage unit may receive and store the row access count from the access counter. In an embodiment, a row access count may be increased (X+1) by receiving a row access count (X) from the access count storage unit. In an embodiment, the increased row access count (X+1) may be transmitted to the access count storage unit. In an embodiment, when the increased row access count matches a threshold value, the row address may be transmitted to the row address storage unit.

According to the present inventive concept, when a row address is input, a row address storage unit may determine whether or not storage capacity is full, and may transmit corresponding information to an overflow controller. In an embodiment, when storage capacity is not full, the row address storage unit may store a received row address. In an embodiment, the row address storage unit may determine whether or not storage capacity is zero when refreshing, and may transmit corresponding information to a refresh controller. In an embodiment, when storage capacity is not zero when refreshing, the row address storage unit may transmit some or all of stored row addresses to the refresh controller, and the transmitted row addresses may be removed from the storage address.

A refresh controller according to the present inventive concept may receive from a row address storage unit whether or not storage capacity is zero when refreshing. In an embodiment, when storage capacity of the storage unit is zero, the refresh controller may refresh rows in a predetermined order. In an embodiment, when storage capacity of the storage unit is not zero, the refresh controller may receive a row address from the storage unit, and may refresh corresponding rows.

An overflow flag storage unit according to the present inventive concept may output an overflow flag bit value and a row address to an overflow controller, when access to a row occurs. In an embodiment, the overflow flag storage unit may receive and store the overflow flag bit from the overflow controller.

An overflow controller according to the present inventive concept may receive an overflow flag bit and a row address from an overflow flag storage unit and, when the overflow flag bit is 1, may transmit the row address to a row address storage unit. In an embodiment, after receiving an input from the row address storage unit whether or not storage capacity is full, when storage capacity is full, the overflow controller may set the overflow flag bit as 1 and may transmit the same to the overflow flag storage unit. In an embodiment, after receiving an input from the row address storage unit whether or not storage capacity is full, when storage capacity is not full, the overflow controller may set the overflow flag bit as 0 and may transmit the same to the overflow flag storage unit.

An access counter according to another embodiment of the present inventive concept may receive a row access count (X) from an access count storage unit, and may increase the row access count (X+1). In an embodiment, when the increased row access count is less than a threshold value, the access counter may transmit the increased row access count (X+1) to the access count storage unit. In an embodiment, when the increased row access count matches the threshold value, the access counter may transmit a row address to a row address storage unit. In an embodiment, when the increased row access count matches the threshold value, the access counter may transmit the increased row access count to an overflow controller. In an embodiment, when the increased row access count matches the threshold value, the access counter may receive a changed row access count from the overflow controller, and may transmit the same to the access count storage unit.

After receiving an input from a row address storage unit whether or not storage capacity is full, when storage capacity is not full, an overflow controller according to another embodiment of the present inventive concept may transmit a row access count received from an access counter to the access counter. In an embodiment, after receiving an input from a row address storage unit whether or not storage capacity is full, when storage capacity is full, the overflow controller may decrease a row access count received from the access counter by 1 and may transmit the same to the access counter.

In a memory device according to the present inventive concept, and a method of operating the same, row hammer disturbance may be decreased by using an overflow flag bit or by adjusting an access count in a queue overflow situation.

In addition, a memory device according to the present inventive concept, and a method of operating the same may prevent a row hammer attack to improve reliability of data.

While example embodiments have been illustrated and described above, it will be apparent to those skilled in the art that modifications and variations could be made without departing from the scope of the present inventive concept as defined by the appended claims.

What is claimed is:

1. A memory device comprising:
a memory cell array including a plurality of memory cells disposed in a plurality of rows and a plurality of columns and connected to a plurality of wordlines and a plurality of bitlines;
a row decoder configured to receive a row address to activate a wordline corresponding to the row address, among the plurality of wordlines;
a row address storage unit;
an access counter configured to:
obtain an increased access count based on a row access count corresponding to the row address,
in response to the increased access count not reaching a reference value, update the row access count corresponding to the row address with the increased access count,
in response to the increased access count reaching the reference value and the row address storage unit having an empty space for the row address, cause the row address storage unit to store a refresh row address generated from the row address, and
in response to the increased access count reaching the reference value and the row address storage unit having no empty space for the row address, retain the row access count corresponding to the row address; and
a refresh controller configured to perform a refresh operation based on the refresh row address stored in the row address storage unit,
wherein the row address storage unit is configured to transfer the refresh row address to the refresh controller for the refresh operation and delete the transferred refresh row address from the row address storage unit.

2. The memory device of claim 1, wherein the access counter is further configured to obtain the increased access count by increasing the row access count by 1.

3. The memory device of claim 1, wherein the reference value includes a multiple of a predetermined value.

4. The memory device of claim 1, further comprising:
a row count (RCNT) storage unit including a plurality of storage units, each of the plurality of storage unit configured to store a row access count of at least one corresponding wordline among the plurality of wordlines,
wherein the access counter is further configured to read the row access count corresponding to the row address from the RCNT storage unit.

5. The memory device of claim 4, wherein each of the plurality of storage units includes at least one count cell having the same structure as a memory cell of the plurality of memory cells.

6. The memory device of claim 1, wherein the refresh controller is further configured to perform the refresh operation on at least one of wordlines adjacent to the wordline corresponding to the row address.

7. A memory device comprising:
a memory cell array including a plurality of memory cells disposed in a plurality of rows and a plurality of columns and connected to a plurality of wordlines and a plurality of bitlines;
a row decoder configured to receive a row address to activate a wordline corresponding to the row address, among the plurality of wordlines;
a row count (RCNT) storage unit including a plurality of storage units, each of the plurality of storage unit configured to store a row access count of at least one corresponding wordline among the plurality of wordlines;
an access counter configured to:
increase the row access count corresponding to the row address stored in the RCNT storage unit, and
in response to the increased row access count reaching a reference value, output a refresh row address based on the row address;
an overflow controller configured to output the refresh row address in response to an overflow flag bit corresponding to the row address having a predetermined bit value;
a row address storage unit configured to store the refresh row address in response to the row address storage unit having an empty space for the row address; and
a refresh controller configured to perform a refresh operation based on the refresh row address stored in the row address storage unit,
wherein the overflow controller is configured to set the overflow flag bit corresponding to the row address as the predetermined bit value in response to the row address storage unit having no empty space for the row address, and
wherein the row address storage unit is configured to transfer the refresh row address to the refresh controller for the refresh operation and delete the transferred refresh row address from the row address storage unit.

8. The memory device of claim 7, wherein the predetermined bit value is 1.

9. The memory device of claim 8, wherein the overflow controller is further configured to, in response to the refresh row address being stored in the row address storage unit, set the overflow flag bit corresponding to the row address as 0.

10. The memory device of claim 7, wherein each of the plurality of storage units includes at least one count cell having the same structure as a memory cell of the plurality of memory cells.

11. The memory device of claim 7, wherein the refresh controller is further configured to perform the refresh operation on at least one of wordlines adjacent to the wordline corresponding to the row address.

12. A memory device comprising:
a memory cell array including a plurality of memory cells disposed in a plurality of rows and a plurality of columns and connected to a plurality of wordlines and a plurality of bitlines;
a row decoder configured to receive a row address to activate a wordline corresponding to the row address, among the plurality of wordlines;
a row count (RCNT) storage unit including a plurality of storage units, each of the plurality of storage unit configured to store a row access count of at least one corresponding wordline among the plurality of wordlines;
a row address storage unit;
an access counter configured to:
read the row access count corresponding to the row address stored in the RCNT storage unit,
in response to an increased access count obtained from the read row access count not reaching a reference value, update the row access count corresponding to the row address with the increased access count,
in response to the increased access count reaching the reference value and the row address storage unit having an empty space for the row address, cause the row address storage unit to store a refresh row address generated from the row address, and
in response to the increased access count reaching the reference value and the row address storage unit having no empty space for the row address, set the row access count corresponding to the row address to be lower than the reference value; and
a refresh controller configured to perform a refresh operation based on the refresh row address stored in the row address storage unit,
wherein the row address storage unit is configured to transfer the refresh row address to the refresh controller for the refresh operation and delete the transferred refresh row address from the row address storage unit.

13. The memory device of claim 12, wherein the access counter is further configured to, in response to the increased access count reaching the reference value and the row address storage unit having no empty space for the row address, retain the row access count corresponding to the row address.

14. The memory device of claim 12, wherein the access counter is further configured to obtain the increased access count by increasing the read row access count by 1.

15. The memory device of claim 12, wherein the reference value includes a multiple of a predetermined value.

16. The memory device of claim 12, wherein each of the plurality of storage units includes at least one count cell having the same structure as a memory cell of the plurality of memory cells.

17. The memory device of claim 12, wherein the refresh controller is further configured to perform the refresh operation on at least one of wordlines adjacent to the wordline corresponding to the row address.

* * * * *